(12) United States Patent
Chen et al.

(10) Patent No.: US 8,264,658 B2
(45) Date of Patent: Sep. 11, 2012

(54) LIQUID CRYSTAL DISPLAY DEVICE AND METHOD OF MANUFACTURING COLOR FILTER SUBSTRATE

(75) Inventors: Weitao Chen, Beijing (CN); Kai Zhao, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 275 days.

(21) Appl. No.: 12/725,613

(22) Filed: Mar. 17, 2010

(65) Prior Publication Data
US 2010/0238387 A1    Sep. 23, 2010

(30) Foreign Application Priority Data

Mar. 18, 2009    (CN) .......................... 2009 1 0080092

(51) Int. Cl.
G02F 1/1339    (2006.01)
(52) U.S. Cl. ........................ 349/156; 349/155
(58) Field of Classification Search ........... 349/155–156
See application file for complete search history.

(56) References Cited

U.S. PATENT DOCUMENTS

| 2005/0200784 A1 | 9/2005 | Kume et al. |
| 2006/0001823 A1 | 1/2006 | Shih |
| 2008/0068553 A1 * | 3/2008 | Tomita et al. ................. 349/153 |

FOREIGN PATENT DOCUMENTS

| CN | 1667474 A | 9/2005 |
| JP | 03-184022 A | 8/1991 |
| TW | 200602766 A1 | 1/2006 |

* cited by examiner

Primary Examiner — Phu Vu
(74) Attorney, Agent, or Firm — Ladas & Parry LLP (57) ABSTRACT

A liquid crystal display device includes an array substrate, a color filter substrate, and a liquid crystal layer provided between the array substrate and the color filter substrate. The color filter substrate includes a substrate, a plurality of color filter units provided on the substrate in the form of matrix, and a black matrix pattern including a lateral structure and a longitudinal structure. The black matrix pattern is provided between the array substrate and the color filter substrate and partially contacts with the array substrate to block light and maintain a cell thickness between the array substrate and the color filter substrate.

13 Claims, 6 Drawing Sheets

Fig. 15

LIQUID CRYSTAL DISPLAY DEVICE AND METHOD OF MANUFACTURING COLOR FILTER SUBSTRATE

BACKGROUND

Embodiments of the present invention relate to a liquid crystal display device and a method of manufacturing a color filter substrate.

With the development of the liquid crystal display technology, thin film transistor liquid crystal displays (TFT-LCDs) device prevail in the liquid crystal display market due to the advantages of small volume, low energy consumption, low radiation, and the like.

A TFT-LCD is formed by assembling the array substrate and the color filter substrate together and providing liquid crystal material between the array substrate and the color filter substrate. The TFT-LCD displays image by using optical anisotropy and birefringence of liquid crystal molecules. Specifically, in the TFT-LCD, the orientation of liquid crystal molecules is changed by the electric field generated by applying a voltage across the electrodes respectively provided on the array substrate and the color filter substrate so that the amount of light transmitted through the color filter substrate is controlled, and thus a desired image can be obtained. Typically, column spacers are provided on the color filter substrate of the TFT-LCD to maintain the cell thickness between the array substrate and the color filter substrate.

Figure 1:
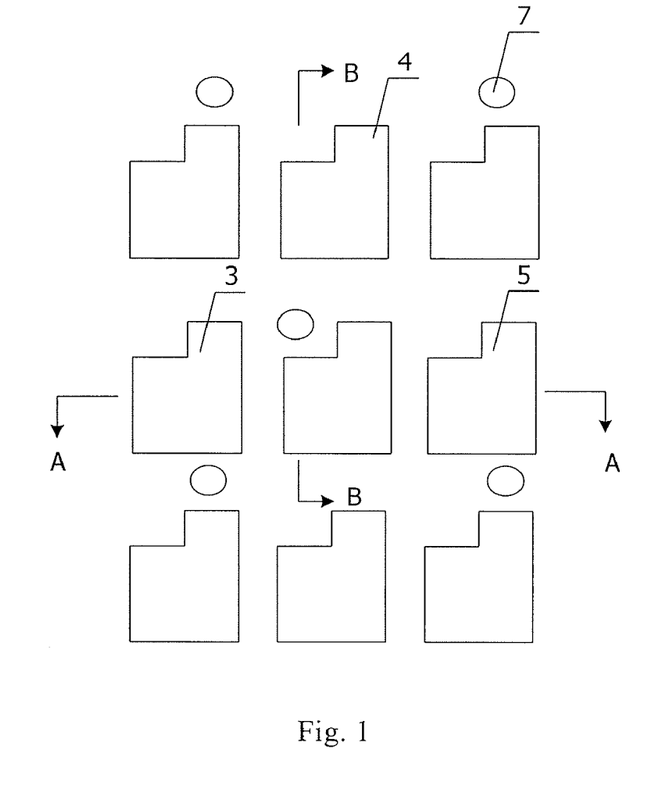
FIG. 1 is a schematic view showing the structure of a color filter substrate.
Figure 2:
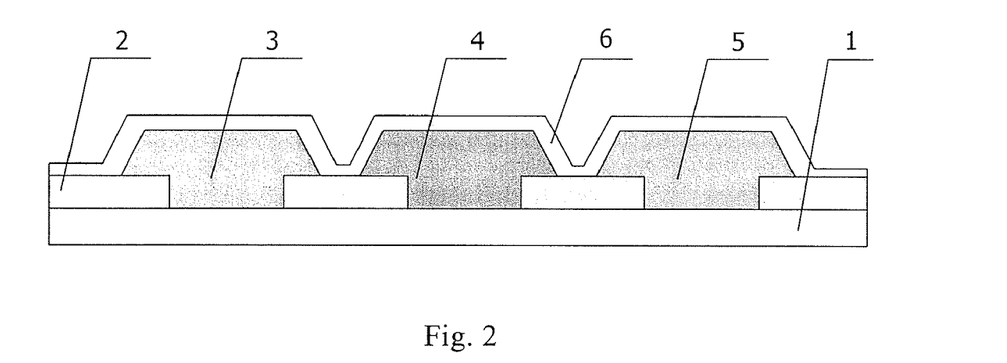
FIG. 2 is a sectional view taken along the A-A direction in FIG. 1.
Figure 3:
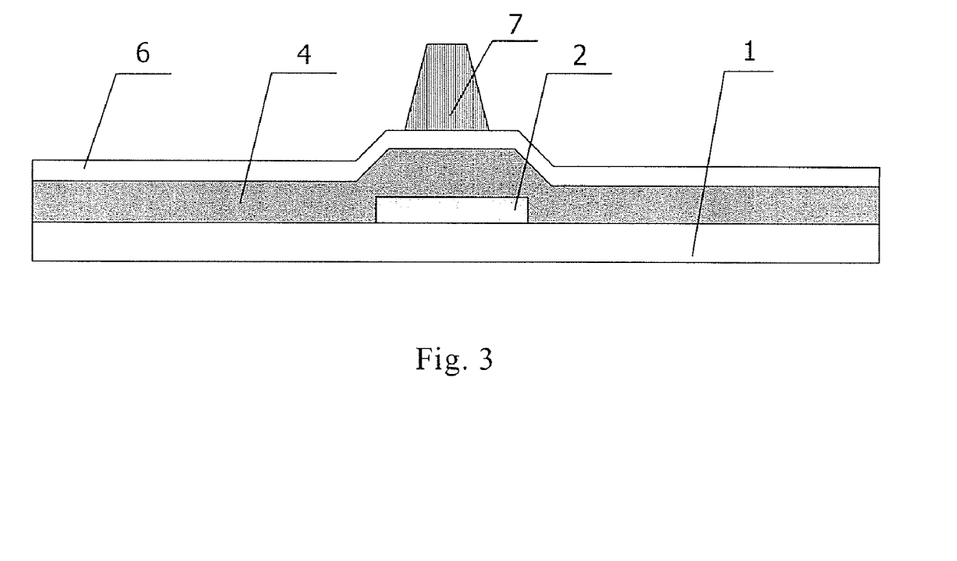
FIG. 3 is a sectional view taken along the B-B direction in FIG. 1.

FIG. 1 is a schematic view showing the structure of a color filter substrate, FIG. 2 is a sectional view taken along the A-A direction in FIG. 1, and FIG. 3 is a sectional view taken along the B-B direction in FIG. 1. As shown in FIGS. 1-3, the color filter substrate includes a black matrix pattern 2 formed on a substrate 1, a color filter unit pattern on the black matrix pattern 2, a common electrode layer 6 on the color filter unit pattern, and a column spacers 7 on the common electrode layer 6. The color filter unit pattern includes at least a red color filter unit 3, a green color filter unit 4 and a blue color filter unit 5. The column spacers 7 on the color filter substrate are used to maintain the cell thickness realize a large-size, high-resolution TFT-LCD.

However, since the area supported by the column spacers is limited, a displacement movement of the column spacers is easily generated when the TFT-LCD is subject to a pressure so that the cell thickness is changed, and as a result, a touch mura defect occurs in the TFT-LCD. In addition, the displacement movement of the column spacers generated when the TFT-LCD is subject to the pressure may further result in light leakage and reduced contrast ratio.

SUMMARY

According to an embodiment of the invention, a liquid crystal display device is provided. The liquid crystal display device includes an array substrate, a color filter substrate, and a liquid crystal layer provided between the array substrate and the color filter substrate. The color filter substrate includes a substrate, a plurality of color filter units provided on the substrate in the form of matrix, and a black matrix pattern including a lateral structure and a longitudinal structure. The black matrix pattern is provided between the array substrate and the color filter substrate and partially contacts with the array substrate to block light and maintain a cell thickness between the array substrate and the color filter substrate.

According to another embodiment of the invention, a method of manufacturing a color filter substrate of a liquid crystal display device is provided. The method includes:

Step 1, forming a color filter unit pattern on a substrate in the form of matrix; and Step 2, forming a black matrix pattern on the substrate after the Step 1, the black matrix pattern protruding from the substrate and including a lateral structure and a longitudinal structure.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention and wherein.

DESCRIPTION OF THE EMBODIMENTS

Figure 4:
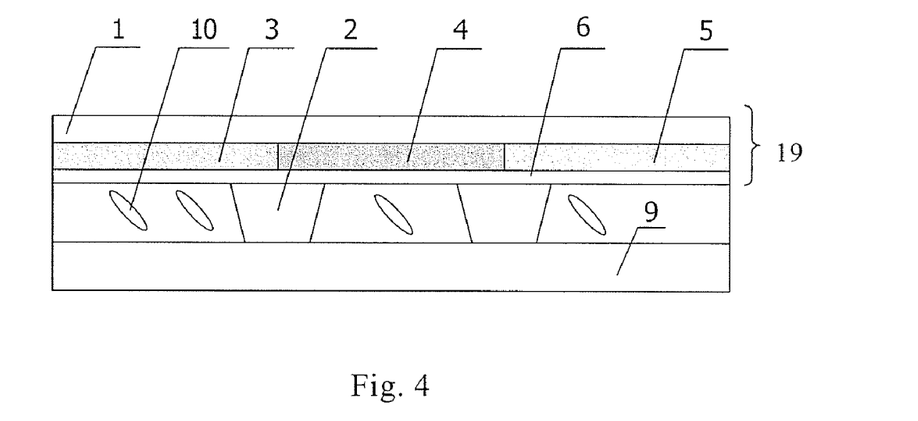
FIG. 4 is a schematic view showing a structure of a liquid crystal display device according to a first embodiment of the invention.

FIG. 4 is a schematic view showing a structure of a liquid crystal display device according to a first embodiment of the invention. As shown in FIG. 4, the liquid crystal display device includes an array substrate 9, a color filter substrate 19 and a liquid crystal layer 10 provided between the array substrate 9 and the color filter substrate 19. The color filter substrate 19 includes a substrate 1, a color filter unit pattern and a black matrix pattern 2. For example, the color filter unit pattern is provided on the substrate 1 in the form of matrix and includes red color filter units 3, green color filter units 4 and blue color filter units 5, but the invention is not limited thereto. The black matrix pattern 2 protrudes from the color filter substrate 19 and includes a lateral structure and a longitudinal structure. The protrusion height of the black matrix pattern 2 is determined dependent on the cell thickness after the array substrate 9 and the color filter substrate 19 are assembled together. In the liquid crystal display device according to this embodiment, the black matrix pattern 2 is provided between the array substrate 9 and the color filter substrate 19 and partially contacts with the array substrate 9 to block light and maintain the cell thickness between the array substrate 9 and the color filter substrate 19. In addition, the color filter substrate 19 may further include a common electrode layer 6.

Figure 5:
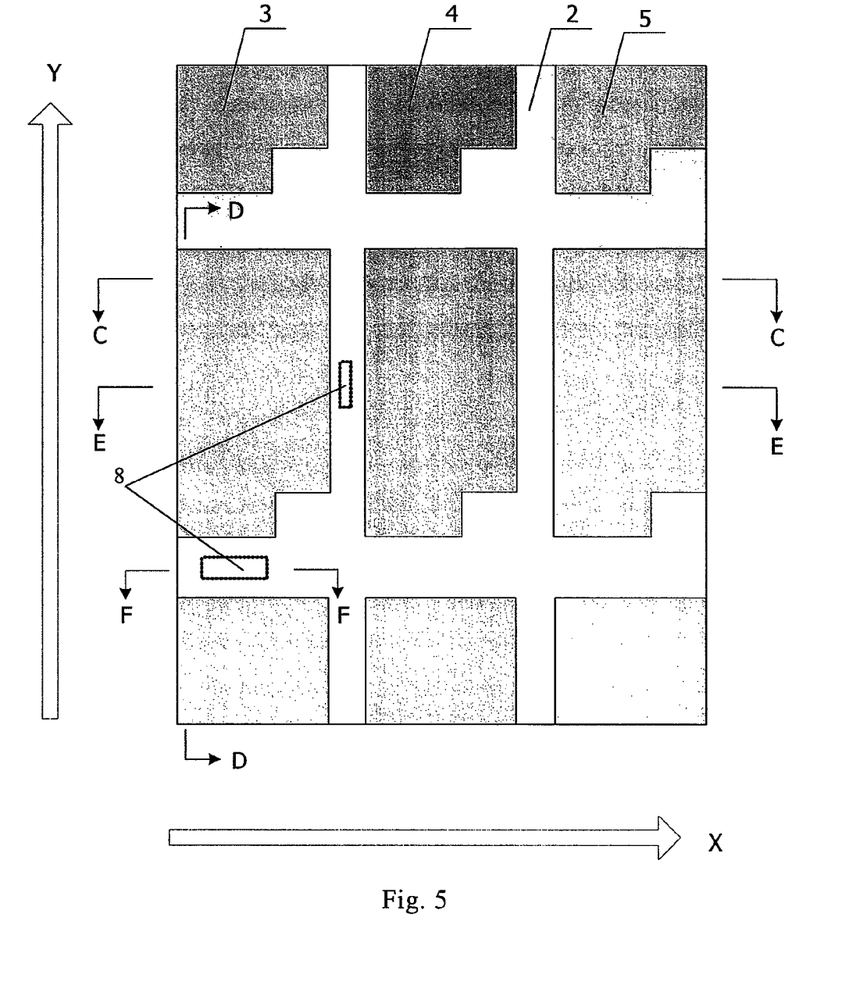
FIG. 5 is a schematic view showing a structure of a color filter substrate according to the first embodiment of the invention.
Figure 6:
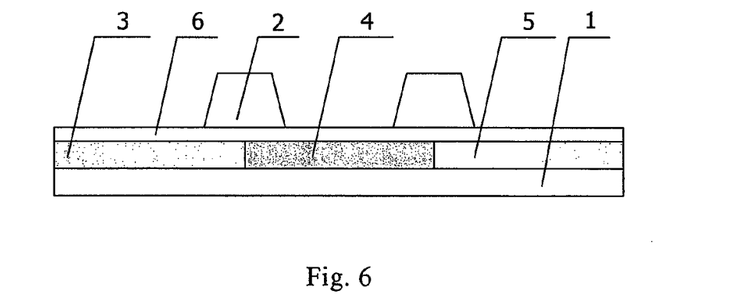
FIG. 6 is a sectional view taken along the C-C direction in FIG. 5.
Figure 7:
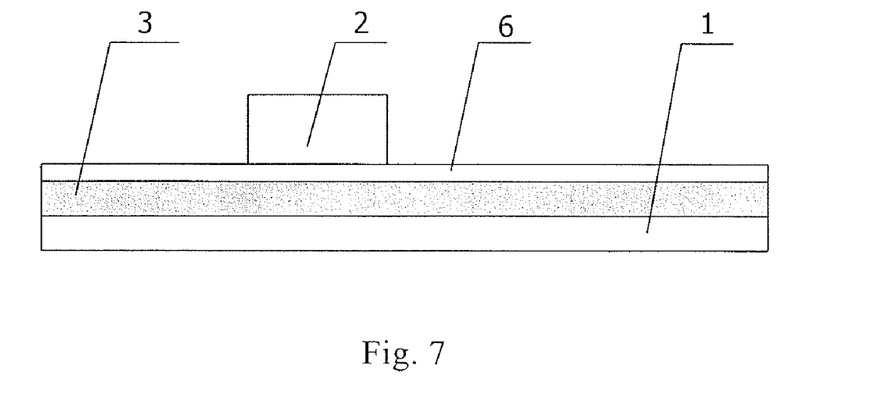
FIG. 7 is a sectional view taken along the D-D direction in FIG. 5.

The structure of the color filter substrate 19 will be described in detail with reference to FIGS. 5-7. FIG. 5 is a schematic view showing the structure of the color filter substrate 19 according to this embodiment, FIG. 6 is a sectional view taken along the C-C direction in FIG. 5, and FIG. 7 is a sectional view taken along the D-D direction in FIG. 5. As shown in FIGS. 5-7, the color filter substrate 19 includes the substrate 1, the color filter unit pattern and the black matrix pattern 2. The color filter unit pattern is provided on the substrate 1 in the form of matrix and the black matrix pattern 2 is provided on the color filter unit pattern. The black matrix pattern 2 protrudes from the color filter substrate 19 and includes a lateral structure and a longitudinal structure, that is, the black matrix pattern 2 is a structure in which a lateral linear structure and a longitudinal linear structure are intersected. In FIG. 4, the lateral direction is denoted by the arrow X and the longitudinal direction is denoted by the arrow Y. The black matrix pattern 2 can be used to replace the conventional column spacers. When the color filer substrate 19 and the array substrate 9 are assembled together, the black matrix pattern 2 is provided between the color filter substrate 19 and the array substrate 9 to maintain the cell thickness therebetween. In this embodiment, the color filter unit pattern includes red color filter units 3, green color filter units 4 and blue color filter units 5, for example.

In this embodiment, the color filter units are sequentially provided on the substrate 1. As shown in FIG. 6, the color filter units are provided on the substrate 1 in the order of the red color filter unit 3, the green color filter unit 4 and the blue color filter unit 5. In addition, the color filter units in this embodiment may be arranged in other order such as the order of the red color filter unit 3, the blue color filter unit 5 and the green color filter unit 4, the order of the green color filter unit 4, the red color filter unit 3 and the blue color filter unit 5, and the like. The red color filter unit 3, the green color filter unit 4 and the blue color filter unit 5 are continuously provided to form an integral structure without an interval. In this embodiment, the black matrix pattern 2 spans adjacent color filter units and is provided on the edge portions of each of the adjacent color filter units. In FIG. 5, the longitudinal structure of the black matrix pattern 2 spans adjacent color filter units and is provided on the edge portions of each of the adjacent color filter units. That is, the black matrix pattern 2 in the longitudinal direction spans the adjacent color filter units and is provided on the edge portions of each of the adjacent color filter units. As shown in FIG. 6, the longitudinal structure of the black matrix pattern 2 spans a red color filter unit 3 and a green color filter unit 4, which are adjacent to each other, and is provided on the edge portions of each of the adjacent red color filter unit 3 and green color filter unit 4, and the longitudinal structure of the black matrix pattern 2 further spans the green color filter unit 4 and a blue color filter unit 5, which are adjacent to each other, and is provided on the edge portions of each of the adjacent green color filter unit 4 and blue color filter unit 5. In addition, according to the arrangement order of the color filter units in this embodiment, the longitudinal structure of the black matrix pattern 2 also spans the adjacent blue color filter unit 5 and red color filter unit 3 and is provided on the edge portions of each of the adjacent blue color filter unit 5 and red color filter unit 3, which is not shown in the drawing. The lateral structure of the black matrix pattern 2 in this embodiment spans adjacent color filter units and is provided on the edge portions of each of the adjacent color filter units. That is, the black matrix pattern 2 in the lateral direction spans the adjacent color filter units and is provided on the edge portion of each of the adjacent color filter units. The way to arrange the lateral structure is similar to the way for the longitudinal structure and is not described here for simplicity.

The thickness of the black matrix pattern 2 in this embodiment is equal to the cell thickness of the liquid crystal panel formed by assembling the color filter substrate 19 and the array substrate 9 together and, for example, in the range of 3 μm to 7 μm.

Furthermore, the color filter substrate 19 in this embodiment may further include the common electrode layer 6. As shown in FIG. 6 and FIG. 7, the common electrode layer 6 is provided between the color filter unit pattern and the black matrix pattern 2 and covers the entire surface of the substrate 1. For example, the thickness of the common electrode layer 6 is in the range of 200 Å to 3000 Å.

Figure 8:
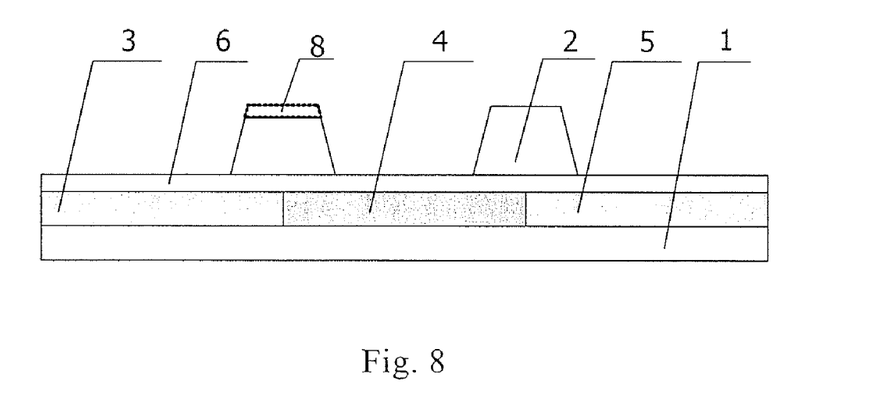
FIG. 8 is a sectional view taken along the E-E direction in FIG. 5.
Figure 9:
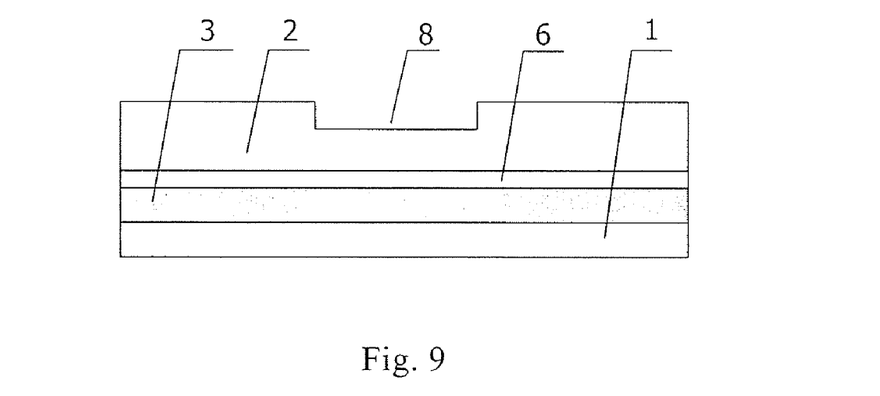
FIG. 9 is a sectional view taken along the F-F direction in FIG. 5.

In addition, in order to avoid the case that liquid crystal material cannot uniformly fill the liquid crystal cell due to the slow diffusion of the liquid crystal material during the process of assembling the color filter substrate and the array substrate together, grooves 8 may be further provided on the projected black matrix pattern 2 (for example, on the top thereof) in this embodiment, as shown in FIG. 8 and FIG. 9. FIG. 8 is a sectional view taken along the E-E direction in FIG. 5, and FIG. 9 is a sectional view taken along the F-F direction in FIG. 5. The number of the grooves 8 is determined as necessary, and a plurality of grooves 8 may be provided. Two grooves 8 are shown in FIG. 5 only by way of example, but the invention is not limited thereto. The grooves 8 may be provided only on the lateral structure of the black matrix pattern 2, only on the longitudinal structure of the black matrix pattern 2, or on both the lateral and longitudinal structures of the black matrix pattern 2. The two rectangles defined by the dashed lines in FIG. 5 represent the groove 8 provided on the lateral structure of the black matrix pattern 2 and the groove 8 provided on the longitudinal structure of the black matrix pattern 2, respectively. The groove 8 provided on the lateral structure of the black matrix pattern 2 is shown in FIG. 9, and the groove provided on the longitudinal structure of the black matrix pattern is shown in FIG. 8. The rectangle defined by the dashed line in FIG. 8 is the groove 8, and the groove 8 can be used as the diffusion channel for the liquid crystal material during the process of assembling the color filter substrate and the array substrate together so that the liquid crystal material diffuses faster to uniformly fill the liquid crystal cell. The depth of the grooves 8 is set to a depth with which the liquid crystal material can freely flow from one sub-pixel to another sub-pixel, and on the other hand the block matrix pattern 2 can block light. In addition, in order that the black matrix pattern 2 can be used for replace the conventional spacers and maintain the cell thickness more reliably, the length of the grooves 8 may be smaller than or equal to that of the sub-pixel in each color filter unit when the groove 8 is provided on the longitudinal structure of the black matrix pattern 2, and the length of the groove 8 is smaller than or equal to the width of the sub-pixel in each color filter unit when the groove 8 is provided on the lateral structure of the black matrix pattern 2. The length of the sub-pixel in the color filter unit pattern refers to the longitudinal length of one sub-pixel in FIG. 5, and the width of the sub-pixel in the color filter unit pattern refers to the lateral length of one sub-pixel in FIG. 5.

The black matrix pattern 2 in this embodiment can be formed by a non-transparent resin material with elasticity. The resin material has some elasticity and can withstand the pressure during the process of assembling the color filter substrate 19 and the array substrate 9 together. For example, the resin material may be photosensitive acrylic resin or hydroxy acid pigment resin. The color filter unit pattern can be formed by photosensitive organic resin or pigment resin. For example, the color filter unit pattern may be formed by photosensitive organic acrylic resin or hydroxy acid pigment resin. Both of the black matrix pattern and the color filter unit pattern may be of a single-layer structure or a multi-layer structure. The common electrode layer 6 can be formed by indium tin oxide (ITO), indium zinc oxide (IZO) or aluminum zinc oxide (AZO).

With the structure in this embodiment, the black matrix pattern protruding from the color filter substrate of the liquid crystal display device is used to replace the conventional column spacers. When the color filter substrate and the array substrate are assembled together, the black matrix pattern is located between the color filter substrate and the array substrate to maintain the cell thickness. Compared with the case in which the conventional column spacers are used, the area supported by the black matrix pattern is increased so that the cell thickness can be maintained more reliably, and thus the touch mura defect can be efficiently reduced. The black matrix pattern can further reduce the displacement movement of the conventional column spacers under pressure, and thus light leakage and reduced contrast ratio when the formed panel is viewed from different angles can be efficiently prevented.

Figure 10:
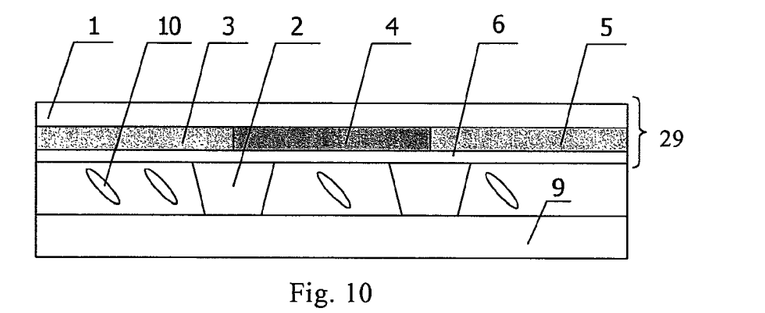
FIG. 10 is a schematic view showing a structure of a liquid crystal display device according to a second embodiment of the invention.

FIG. 10 is a schematic view showing a structure of a liquid crystal display device according to a second embodiment of the invention. As shown in FIG. 10, the difference between this embodiment and the first embodiment is the structure of the color filter substrate.

Figure 11:
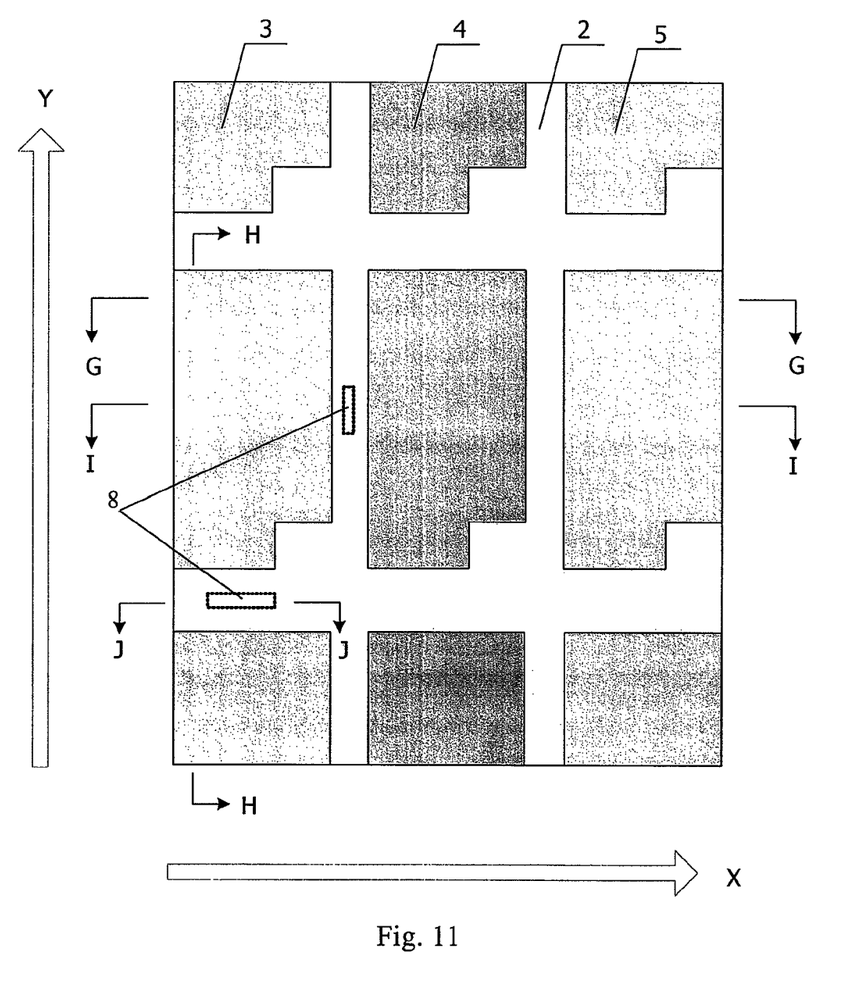
FIG. 11 is a schematic view showing a structure of a color filter substrate according to the second embodiment of the invention.
Figure 12:
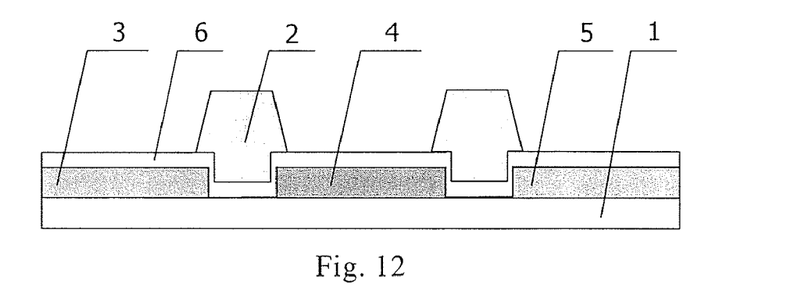
FIG. 12 is a sectional view taken along the G-G direction in FIG. 11.
Figure 13:
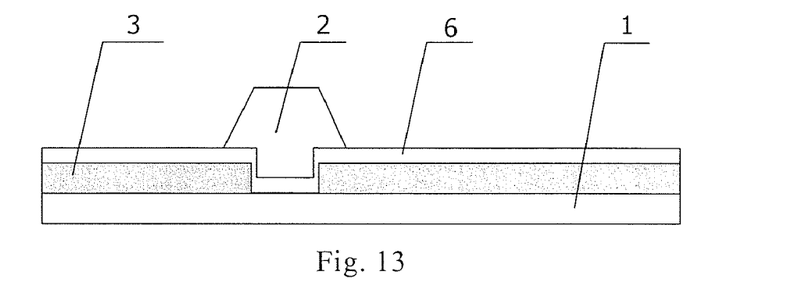
FIG. 13 is a sectional view taken along the H-H direction in FIG. 11.

The structure of the color filter substrate 29 in this embodiment will be described in detail with reference to FIGS. 11-13. FIG. 11 is a schematic view showing a structure of a color filter substrate according to the second embodiment of the invention, FIG. 12 is a sectional view taken along the G-G direction in FIG. 11, and FIG. 13 is a sectional view taken along the H-H direction in FIG. 11. As shown in FIGS. 11-13, the color filter substrate 29 includes a substrate 1, a color filter unit pattern and a black matrix pattern 2. The color filter unit pattern is provided on the substrate 1 in the form of matrix and the black matrix pattern 2 is provided on the color filter unit pattern. The black matrix pattern 2 protrudes from the color filter substrate 29 and includes a lateral structure and a longitudinal structure, that is, the black matrix pattern 2 is a structure in which a lateral linear structure and a longitudinal linear structure are intersected. In FIG. 9, the lateral direction is denoted by the arrow X and the longitudinal direction is denoted by the arrow Y. The black matrix pattern 2 can be used to replace the conventional column spacers. When the color filer substrate 29 and the array substrate 9 are assembled together, the black matrix pattern 2 is between the color filter substrate 29 and the array substrate 9 to maintain the cell thickness. In this embodiment, the color filter unit pattern includes red color filter units 3, green color filter units 4 and blue color filter units 5, for example.

In this embodiment, the color filter units are provided on the substrate 1 in order with an interval between two adjacent color filter units. As shown in FIG. 12, in the lateral direction, the color filter units are provided on the substrate 1 in the order of the red color filter unit 3, the green color filter unit 4 and the blue color filter unit 5. In addition, the color filter units in this embodiment may be arranged in other order such as the order of the red color filter unit 3, the blue color filter unit 5 and the green color filter unit 4, the order of the green color filter unit 4, the red color filter unit 3 and the blue color filter unit 5, and the like. The red color filter unit 3, the green color filter unit 4 and the blue color filter unit 5 are sequentially provided with an interval, and for example, they may be provided with a uniform interval. In the longitudinal direction, the color filter units are also sequentially provided with an interval, and for example, they may be provided with a uniform interval. As shown in FIG. 13, the red color filter unit 3 is provided on the substrate 1 with a uniform interval. Because the above-described intervals exist between the adjacent color filter units, the black matrix pattern 2 in this embodiment fills the intervals between the adjacent color filter units, and further the black matrix pattern 2 spans the adjacent color filter units and is provided on the edge portions of each of the adjacent color filter units. As shown in FIG. 12, the interval between the red color filter unit 3 and the green color filter unit 4 and the interval between the green color filter unit 4 and the blue color filter unit 5 are filled by the black matrix pattern 2. As shown in FIG. 13, the intervals between the adjacent red color filter units 3 in the longitudinal direction are also filled by the black matrix pattern 2.

In addition, the color filter substrate 29 in this embodiment may further include a common electrode layer 6, which is the same as that in the first embodiment and not described here for simplicity.

Figure 14:
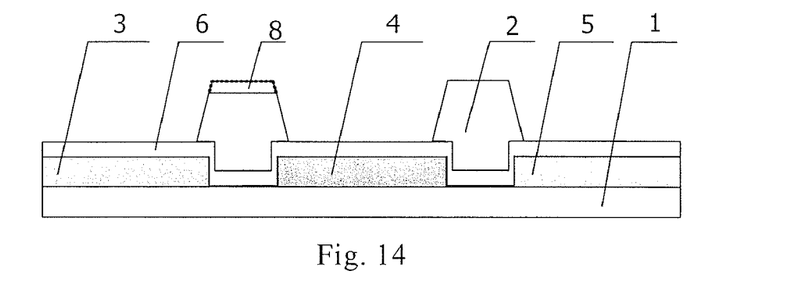
FIG. 14 is a sectional view taken along the I-I direction in FIG. 11.
Figure 15:
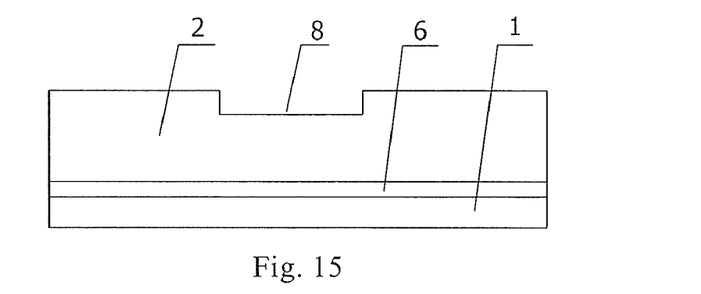
FIG. 15 is a sectional view taken along the J-J direction in FIG. 11.

In addition, in order to avoid the case that liquid crystal material cannot uniformly fill the liquid crystal cell due to the slow diffusion of the liquid crystal material during the process of assembling the color filter substrate and the array substrate together, grooves 8 may be provided on the projected black matrix pattern 2 (for example, on the top thereof) in this embodiment, as shown in FIG. 14 and FIG. 15. FIG. 14 is a sectional view taken along the I-I direction in FIG. 11, and FIG. 15 is a sectional view taken along the J-J direction in FIG. 11. The grooves 8 in this embodiment is the same as those in the first embodiment and the detail description thereof is omitted here for simplicity.

With the structure in this embodiment, the black matrix pattern protruding from the color filter substrate of the liquid crystal display device is used to replace the conventional column spacers. When the color filter substrate and the array substrate are assembled together, the black matrix pattern is located between the color filter substrate and the array substrate to maintain the cell thickness of the formed liquid crystal panel. Compared with the case in which the conventional column spacers are used, the area supported by the black matrix pattern is increased so that the cell thickness can be maintained more reliably, and thus the touch mura defect can be efficiently reduced. The black matrix pattern can further reduce the displacement movement of the conventional column spacers under a pressure, and thus light leakage and reduced contrast ratio caused when the formed panel is viewed from different angles can be efficiently prevented.

The structures of the red color filter units, the blue color filter units and the green color filter units in the above first and second embodiments only are two typical structures and may be modified as necessary. The modified structures are also within the scope of the invention.

A first embodiment of the method of manufacturing the color filter substrate in the liquid crystal display device according to the invention includes the following steps.

Step 101, forming a color filter unit pattern in the form of matrix on a substrate.

Step 102, forming a black matrix pattern on the substrate after the Step 101, the black matrix pattern protruding from the substrate and including a lateral structure and a longitudinal structure.

The black matrix pattern in this embodiment can be used to replace the conventional column spacers. When the color filter substrate and the array substrate are assembled together, the black matrix pattern is located between the color filter substrate and the array substrate and partially contacts with array substrate to block the light and maintain the cell thickness between the color filter substrate and the array substrate.

With the method of manufacturing the color filter substrate in this embodiment, the area supported by the black matrix pattern can be increased so that the cell thickness can be maintained more reliably, and thus the touch mura defect can be efficiently reduced. The black matrix pattern can further avoid the displacement movement of the conventional column spacers under a pressure, and thus light leakage and reduced contrast ratio caused when the formed panel is viewed from different angles can be efficiently reduced.

A second embodiment of the method of manufacturing the color filter substrate in the liquid crystal display device according to the invention includes the following steps.

Step 201, forming red color filter units, green color filter units and blue color filter units on a substrate in order.

An example of forming the color filter unit pattern may include the following steps. A material for the red color filter units with a thickness of 1 μm to 5 μm is applied to the substrate by a coating dispersion method. A mask is provided on the material for the red color filter units, and the material for the red color filter units is exposed through the mask. The exposed material for the red color filter units is developed to form the red color filter units. The material used here to form the red color filter units may be a photosensitive resin material. When a material which is not photosensitive is used, the red color filter unit is formed by a normal patterning process by using photoresist, which is not described here for simplicity.

By using the method similar to that for the red color filter units, the green color filter units and the blue color filter units can be sequentially formed on the substrate. The red color filter units, the green color filter units and the blue color filter units may be provided on the substrate in order with an interval or without an interval between adjacent color filter units as shown in FIGS. 5-7 and FIGS. 11-13.

The red color filter units 3, the green color filter units 4 and the green color filter units 5 in this embodiment may be provided in other order.

Step 202, forming a common electrode layer on the substrate after the Step 201. The common electrode layer is formed on the red color filter units, the green color filter units and the blue color filter units and covers the entire surface of the substrate.

As for the common electrode layer, FIGS. 6-9 and FIG. 12-15 can be referred to.

Step 203, forming a black matrix pattern on the substrate after the Step 202. The black matrix pattern is formed on the common electrode layer.

An example of forming the black matrix pattern may include the following steps. A material for the black matrix pattern with a thickness of 1 μm to 5 μm is applied to the substrate with the common electrode layer by a coating dispersion method. A mask is provided on the material for the black matrix pattern. The material for the black matrix pattern is exposed through the mask, and the material for the black matrix pattern which has been exposed is further developed to form the black matrix pattern. The material used here to form the black matrix pattern may be a photosensitive resin material. When a material which is not photosensitive is used, the black matrix pattern is formed by a normal patterning process by using the photoresist, which is not described here for simplicity.

When grooves are desired to be formed on the black matrix pattern, the grooves may be formed by a gray-tone mask method or a half-tone mask method. During the formation of the black matrix pattern, slits are provided on the mask and the material for the black matrix is exposed through the mask with the slits, and then the material for the black matrix pattern which has been exposed is developed to form the black matrix pattern with the grooves. Specifically, the positions where the grooves to be formed are exposed through the slits of the mask, and then the developing process is performed to form the black matrix pattern with the grooves. By using the gray-tone mask method or the half-tone mask method, the exposure amount at the positions where the grooves to be formed can be adjusted to realize partial exposure, the partially exposed positions corresponds to the positions to form the grooves on the black matrix pattern, and thus the depth of the grooves can be controlled. As for the grooves, FIGS. 8-9 and FIGS. 14-15 can be referred to. In this embodiment, the grooves are formed on the lateral structure or the longitudinal structure of the black matrix pattern.

The black matrix pattern on the common electrode layer in this embodiment can be used to replace the conventional column spacers. When the color filter substrate and the array substrate are assembled together, the black matrix pattern protruding from the color filter substrate is located between the color filter substrate and the array substrate to maintain the cell thickness between the color filter substrate and the array substrate.

With the method of manufacturing the color filter substrate in this embodiment, the area supported by the black matrix pattern is increased so that the cell thickness can be maintained more reliably, and thus the touch mura defect can be efficiently reduced. The black matrix pattern can further avoid the displacement movement of the conventional column spacers under a pressure, and thus light leakage and reduced contrast ratio caused when the formed panel is viewed from different angles can be efficiently prevented.

The color filter substrate in the embodiments of the invention can be applied to the liquid crystal display device of a vertical electric field type (e.g., TN type LCD) or a horizontal electric field type (e.g., an FFS type LCD or IPS type LCD).

It should be appreciated that the embodiments described above are intended to illustrate but not limit the present invention. Although the present invention has been described in detail herein with reference to the preferred embodiments, it should be understood by those skilled in the art that the present invention can be modified and some of the technical features can be equivalently substituted without departing from the spirit and scope of the present invention.

What is claimed is:

1. A liquid crystal display device, including:
an array substrate;
a color filter substrate; and a liquid crystal layer provided between the array substrate and the color filter substrate, wherein the color filter substrate includes:
   a substrate;
      a plurality of color filter units provided on the substrate in the form of matrix; and
      a black matrix pattern including a lateral structure and a longitudinal structure that are formed integrally to enclose pixals, wherein the black matrix pattern is provided between the array substrate and the color filter substrate and partially contacts with the array substrate to block light and maintain a cell thickness between the array substrate and the color filter substrate, and wherein grooves are provided on the black matrix pattern, the grooves are provided on the lateral structure of the black matrix pattern and/or the longitudinal structure of the black matrix pattern, and the depth of the grooves are set to a depth, with which liquid crystal material can freely flow from one pixel to another pixel and the block matrix pattern is capable of blocking light.

2. The liquid crystal display device according to claim 1, wherein the color filter units are continuously provided on the substrate, and the black matrix pattern spans adjacent color filter units and is provided on the edge portions of each of the adjacent color filter units.

3. The liquid crystal display device according to claim 1, wherein the color filter units are provided on the substrate with an interval between adjacent color filter units, and the interval between the adjacent color filter units is filled by the black matrix pattern.

4. The liquid crystal display device according to claim 3, wherein the black matrix pattern spans the adjacent color filter units and is provided on the edge portions of each of the adjacent color filter units.

5. The liquid crystal display device according to claim 1, wherein the length of the grooves is smaller than or equal to the lateral width of the sub-pixel of each color filter unit when the grooves are provided on the lateral structure of the black matrix pattern.

6. The liquid crystal display device according to claim 1, wherein the length of the grooves is smaller than or equal to the longitudinal length of the sub-pixel of each color filter unit when the grooves are provided on the longitudinal structure of the black matrix pattern.

7. The liquid crystal display device according to claim 1, wherein the black matrix pattern is formed by a non-transparent resin material with elasticity.

8. A method of manufacturing a color filter substrate of a liquid crystal display device, including:
   Step 1, forming a color filter unit pattern on a substrate in the form of matrix; and
   Step 2, forming a black matrix pattern on the substrate after the Step 1, the black matrix pattern protruding from the substrate and including a lateral structure and a longitudinal structure that are formed integrally to enclose pixels,
wherein grooves are provided on the black matrix pattern, and the grooves are provided on the lateral structure of the black matrix pattern and/or the longitudinal structure of the black matrix pattern.

9. The method according to claim 8, wherein forming the black matrix pattern on the substrate in the Step 2 includes:
   applying a photosensitive organic resin material for the black matrix pattern on the substrate after Step 1;
   exposing the photosensitive organic resin material by using a mask; and
   developing the photosensitive organic resin material for the black matrix pattern which has been exposed to form the black matrix pattern.

10. The method according to claim 8, wherein forming the black matrix pattern on the substrate in the Step 2 includes:
   applying a photosensitive organic resin material for the black matrix pattern on the substrate after Step 1;
   exposing the photosensitive organic resin material by using a mask; and
   developing the photosensitive organic resin material for the black matrix pattern which has been exposed to form the black matrix pattern.

11. The method according to claim 10, wherein the mask is a gray-tone mask or a half-tone mask, and the partially exposing portions of the mask corresponds the positions on the black matrix pattern to form the grooves.

12. The method according to claim 8, wherein the Step 1 further includes:
   forming a common electrode layer on the substrate after forming the color filter unit pattern, so that the common electrode layer is provided between the color filter unit pattern and the black matrix pattern.

13. The method according to claim 8, wherein the Step 1 further includes:
   forming a common electrode layer on the substrate after forming the color filter unit pattern, so that the common electrode layer is provided between the color filter unit pattern and the black matrix pattern.

\* \* \* \* \*